US012638475B2

(12) United States Patent  
Min et al.

(10) Patent No.: US 12,638,475 B2  
(45) Date of Patent: May 26, 2026

(54) EYE MARGIN TEST METHOD AND ELECTRONIC APPARATUS PERFORMING TEST OPERATION BASED ON THE SAME

(71) Applicant: Samsung Electronics Co., Ltd., Suwon-si (KR)

(72) Inventors: Woongki Min, Suwon-si (KR); Hyeonji Han, Suwon-si (KR); Myeongcheol Kim, Suwon-si (KR); Hyoungjoong Kim, Suwon-si (KR); Sangho Kim, Suwon-si (KR); Younggyun Oh, Suwon-si (KR); Soomin Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 146 days.

(21) Appl. No.: 18/599,336

(22) Filed: Mar. 8, 2024

(65) Prior Publication Data

US 2024/0310414 A1     Sep. 19, 2024

(30) Foreign Application Priority Data

Mar. 13, 2023    (KR) ........................ 10-2023-0032815

(51) Int. Cl.  
*G01R 13/02*          (2006.01)

(52) U.S. Cl.  
CPC ................................... *G01R 13/02* (2013.01)

(58) Field of Classification Search  
CPC ...................................................... G01R 13/02  
USPC ......................................................... 375/371  
See application file for complete search history.

(56) References Cited

U.S. PATENT DOCUMENTS

| | | | |
|---|---|---|---|
| 8,074,126 B1 | 12/2011 | Qian et al. | |
| 9,246,666 B2 | 1/2016 | Kil | |
| 9,553,635 B1 | 1/2017 | Sejpal et al. | |
| 9,836,121 B2 | 12/2017 | Wu et al. | |
| 10,313,068 B1 | 6/2019 | Ahmed et al. | |
| 10,630,295 B2 | 4/2020 | Seno | |
| 10,686,582 B1 * | 6/2020 | Pasdast ..................... H03L 1/00 | |
| 10,819,499 B2 | 10/2020 | Hormati | |
| 10,911,052 B2 | 2/2021 | Littmann et al. | |

* cited by examiner

*Primary Examiner* — Dominic D Saltarelli

(74) *Attorney, Agent, or Firm* — Harness, Dickey & Pierce, P.L.C.

(57)          ABSTRACT

An eye margin test method includes receiving an analog input signal, receiving an analog input signal, generating a recovery clock signal based on the digital input signal, delaying the recovery clock signal by adjusting a first delay control code, obtaining a first delay margin code based on the delayed recovery clock signal, delaying the digital input signal by adjusting a second delay control code, obtaining a second delay margin code based on the delayed digital input signal, and obtaining an eye margin code by adding the first delay margin code and the second delay margin code.

20 Claims, 15 Drawing Sheets

FIG. 6

DELAY MARGIN CODE1=2

| DC1 | 1 | 2 | 3 | 4 | 5 | 6 | 7 | 8 | ... |
|---|---|---|---|---|---|---|---|---|---|
| Sampling error count | 0 | 0 | 1 | 6 | 10 | 10 | 10 | 10 | ... |

DELAY MARGIN CODE2=4

| DC1 | 1 | 2 | 3 | 4 | 5 | 6 | 7 | 8 | ... |
|---|---|---|---|---|---|---|---|---|---|
| Sampling error count | 0 | 0 | 0 | 0 | 1 | 6 | 10 | 10 | ... |

EYE MARGIN CODE=6

EYE MARGIN TEST METHOD AND ELECTRONIC APPARATUS PERFORMING TEST OPERATION BASED ON THE SAME

CROSS-REFERENCE TO RELATED APPLICATION

This U.S. non-provisional application claims the benefit of priority under 35 U.S.C. § 119 to Korean Patent Application No. 10-2023-0032815, filed on Mar. 13, 2023, in the Korean Intellectual Property Office, the disclosure of which is incorporated by reference herein in its entirety.

BACKGROUND

Various example embodiments of the inventive concepts relate to an eye margin test method, an electronic apparatus performing a test operation based on the same, and/or a system performing a test operation based on the same, etc., and more specifically, to a method, an apparatus for obtaining an eye margin from an input signal and a recovery clock signal, and/or a system including the apparatus, etc.

Data signals and/or electronic signals transmitted from transmitters may be attenuated by noise effects, such as Inter Symbol Interference (ISI), etc. Therefore, it may be desired and/or necessary to check the amount of eye margin in a data signal when designing a receiver. Here, the eye margin may refer to the length of the eye with respect to a time axis in an eye diagram of the data signal in which the accumulated waveform of the received data signal is represented on the time axis. Unlike testing the eye margin through computer simulations which may be idealized and an inaccurate representation of real world data signals, it may be difficult to determine the eye margin of a signal inside a receiver when the receiver is implemented as a semiconductor circuit. Therefore, a method of identifying the eye margin of the signal inside the receiver is desired and/or required.

SUMMARY

Various example embodiments of the inventive concepts provide a method of testing an eye margin of a signal received by a receiver receiving a signal transmitted from a transmitter, an electronic apparatus that performs a test operation based on the eye margin test method, and/or a system including the electronic apparatus, etc.

According to at least one example embodiment of the inventive concepts, there is provided a method of testing an eye margin, the eye margin test method including receiving an analog input signal, converting the analog input signal into a digital input signal, generating a recovery clock signal based on the digital input signal, delaying the recovery clock signal by adjusting a first delay control code, obtaining a first delay margin code based on the delayed recovery clock signal, delaying the digital input signal by adjusting a second delay control code, obtaining a second delay margin code based on the delayed digital input signal, and obtaining an eye margin code by adding the first delay margin code and the second delay margin code.

According to at least one example embodiment of the inventive concepts, there is provided an electronic apparatus including processing circuitry configured to receive an analog input signal and convert the analog input signal into a digital input signal, generate a recovery clock signal based on the digital input signal, generate a first delay control code and a second delay control code, generate a delayed recovery clock signal from the recovery clock signal based on the first delay control code, and generate a delayed input signal from the digital input signal based on the second delay control code.

According to at least one example embodiment of the inventive concepts, there is provided an electronic apparatus including processing circuitry configured to generate a mode control signal, an input delay control code, and a clock signal delay control code, generate a second input signal delayed from a first input signal based on the input delay control code, output one of the first input signal and the second input signal as a selected input signal based on the mode control signal, generate a recovery clock signal based on the selected input signal, and generate a delayed recovery clock signal from the recovery clock signal based on the clock signal delay control code.

According to at least one example embodiment of the inventive concepts, there is provided a method of testing an electronic apparatus, the method including receiving an analog input signal, converting the analog input signal into a digital input signal, generating a recovery clock signal based on the digital input signal, delaying the recovery clock signal by adjusting a first delay control code, delaying the recovery clock signal by adjusting a first delay control code, delaying the digital input signal by adjusting a second delay control code, obtaining a second delay margin code based on the delayed digital input signal, obtaining an eye margin code by adding the first delay margin code and the second delay margin code, and determining whether the electronic apparatus is defective based on the eye margin code.

BRIEF DESCRIPTION OF THE DRAWINGS

Various example embodiments of the inventive concepts will be more clearly understood from the following detailed description taken in conjunction with the accompanying drawings in which:

FIG. 6 is a diagram illustrating a method of obtaining an eye margin code, according to at least one example embodiment;

DETAILED DESCRIPTION

Hereinafter, various example embodiments of the inventive concepts will be described in detail with reference to the accompanying drawings.

Figure 1:
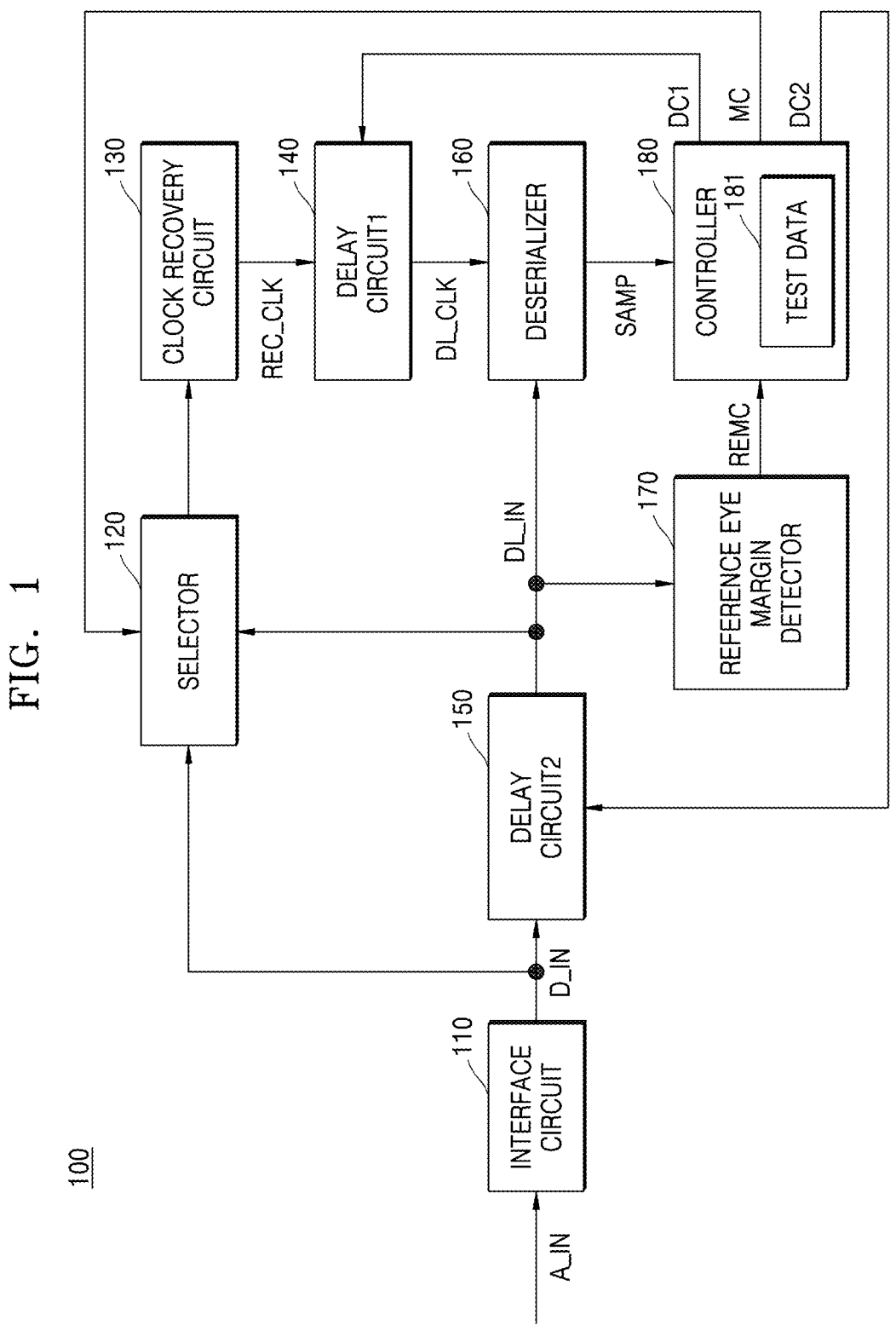
FIG. 1 is a block diagram schematically illustrating an electronic device, according to at least one example embodiment.

FIG. 1 is a block diagram schematically illustrating an electronic device, according to at least one example embodiment.

The electronic apparatus 100 may be implemented as one of various apparatuses such as a desktop computer, a laptop computer, a server, a tablet, a smartphone, a wearable device, an Internet of Things (IoT) device, a video game machine, a home appliance, a medical device, etc.

However, the example embodiments of the inventive concepts are not limited thereto, and in some example embodiments, an electronic apparatus 100 may be implemented as any single electronic apparatus. In some example embodiments, an electronic device 100 may be implemented as circuits, modules, chips, and/or objects at a package level.

The electronic apparatus 100 may include an interface circuit 110, a selector 120, a clock signal recovery circuit 130, a first delay circuit 140, a second delay circuit 150, a deserializer 160, a reference eye margin detector 170, and/or a controller 180, etc., but is not limited thereto, and for example, may include a greater or lesser number of constituent components. According to some example embodiments, the interface circuit 110, the selector 120, the clock signal recovery circuit 130, the first delay circuit 140, the second delay circuit 150, the deserializer 160, the reference eye margin detector 170, and/or the controller 180, etc., may be implemented as processing circuitry. Processing circuitry may include hardware or hardware circuit including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto.

The interface circuit 110 may receive an analog input signal A_IN and convert the analog input signal A_IN into a digital input signal D_IN. The analog input signal A_IN may be at least one signal transmitted from an external transmitter (not shown), such as an electrical signal transmitter (e.g., a high-speed data bus transmitter, etc.), a radio frequency-based transmitter (e.g., wireless network transmitter, etc.), but the example embodiments are not limited thereto. In FIGS. 1 to 12, it is assumed that the example embodiments implement the C-physical layer (C-PHY) interface protocol for the sake of clarity and brevity, but the example embodiments are not limited thereto, and the example embodiments may be modified to implement other data interface protocols as well.

In some example embodiments, the analog input signal A_IN may be a three-phase signal including a first sub-signal, a second sub-signal, and a third sub-signal, but the example embodiments are not limited thereto. For example, the analog input signal A_IN may be a signal generated according to and/or based on the C-PHY interface protocol, but the example embodiments are not limited thereto, and the signal may be generated on other protocols. According to the C-PHY interface protocol, each of the first sub-signal, the second sub-signal, and the third sub-signal may have any one of a high voltage level, a mid voltage level, and a low voltage level defined by the C-PHY interface protocol, but the example embodiments are not limited thereto, and if a protocol besides the C-PHY interface protocol is implemented, other voltage levels may be considered.

The interface circuit 110 may convert the analog input signal A_IN into the digital input signal D_IN based on the voltage level difference between the first sub-signal, the second sub-signal, and/or the third sub-signal. A specific operation of converting the analog input signal A_IN into the digital input signal D_IN by the interface circuit 110 will be described later with reference to FIG. 7.

The second delay circuit 150 may generate a delayed input signal DL_IN based on the digital input signal D_IN under the control of a second delay control code DC2 (e.g., a delay control signal, a delay signal, etc.). The second delay control code DC2 may be a signal for adjusting a length of delay of the digital input signal D_IN. The second delay circuit 150 may generate the delayed input signal DL_IN based on the digital input signal D_IN and a length of time (e.g., delay time period, etc.) indicated by and/or corresponding to the second delay control code DC2.

The selector 120 may receive the digital input signal D_IN and the delayed input signal DL_IN, and output either the digital input signal D_IN or the delayed input signal DL_IN under the control of a mode control signal MC (e.g., a mode signal, etc.). For example, when the mode control signal MC has a value of "1" corresponding to an eye margin test mode or a dual mode, the selector 120 may output the digital input signal D_IN under the control of the mode control signal MC, but the example embodiments are not limited thereto.

Meanwhile, when the mode control signal MC has a value of "0" corresponding to a skew compensation mode, the selector 120 may output the delayed input signal DL_IN under the control of the mode control signal MC, but the example embodiments are not limited thereto.

The clock signal recovery circuit 130 may generate a recovery clock signal REC_CLK based on the output of the selector 120. In other words, the clock signal recovery circuit 130 may recover a clock signal corresponding to the phase and/or frequency of the digital input signal D_IN and/or the delayed input signal DL_IN output by the selector 120. For example, the clock signal recovery circuit 130 may generate the recovery clock signal REC_CLK so that the edge of the clock signal is located in the center of the digital input signal D_IN and/or the delayed input signal DL_IN. In some example embodiments, the clock signal recovery circuit 130 may be a clock signal and data recovery (CDR) circuit that restores a clock signal and/or data based on the output of the selector 120.

The first delay circuit 140 may generate a delayed recovery clock signal DL_CLK from the recovery clock signal REC_CLK under the control of a first delay control code DC1 (e.g., a delay control signal, a delay signal, etc.).

The first delay control code DC1 may be a signal for adjusting a length of delay of the recovery clock signal REC_CLK. The first delay circuit 140 may generate the delayed recovery clock signal DL_CLK based on the recovery clock signal REC_CLK for a length of time (e.g., delay time period, etc.) indicated by and/or corresponding to the first delay control code DC1.

The deserializer 160 may generate at least one sampling signal SAMP based on the delayed input signal DL_IN and/or the delayed recovery clock signal DL_CLK. In other words, the deserializer 160 may generate the sampling signal SAMP by sampling the delayed input signal DL_IN at the rising and falling edges of the delayed recovery clock signal DL_CLK, but is not limited thereto.

As will be described later with reference to FIG. 10, the delayed input signal DL_IN may include a preamble section for which a preamble signal with a desired periodic waveform is received and a packet data section for which packet data is received. The preamble signal may be a signal (e.g., a header signal, etc.) received before packet data is received by the electronic apparatus 100. The reference eye margin detector 170 may detect a reference clock signal from the delayed input signal DL_IN having a first frequency pulse waveform in a preamble section. Thereafter, the controller 180 may test the eye margin using the and/or based on the packet data section.

The reference eye margin detector 170 may detect the reference clock signal from the delayed input signal DL_IN having the first frequency pulse waveform. For example, the delayed input signal DL_IN may include a preamble signal having a first frequency waveform, etc.

The reference eye margin detector 170 may detect the reference clock signal having a pulse waveform of a second frequency higher than a first frequency based on a preamble signal, but the example embodiments are not limited thereto.

In addition, the reference eye margin detector 170 may generate a code and/or signal corresponding to a half cycle (e.g., half of a duty cycle) of the second frequency pulse using the second frequency and/or the operating speed (e.g., operating frequency, clock frequency, etc.) of the electronic apparatus 100. For example, when the electronic apparatus 100 operates at a speed of 10 Gps, the half cycle of the second frequency pulse may be 0.1 ns, which is the reciprocal of 10 Gps. Here, the code corresponding to the half cycle of the second frequency pulse may be referred to as a reference eye margin code (REMC) or a unit interval (UI) code.

In FIG. 1, the reference eye margin detector 170 has been illustrated as a component separate from the controller 180, but in some example embodiments, the reference eye margin detector 170 may be a component of the controller 180, etc., or in other words, the controller 180 may perform the operations of the reference eye margin detector 170 and/or one or more other components of FIG. 1, etc.

The controller 180 may generate the first delay control code DC1, the second delay control code DC2, and/or the mode control signal MC, etc. The controller 180 may control the first delay circuit 140, the second delay circuit 150, and/or the selector 120, etc., by adjusting the first delay control code DC1, the second delay control code DC2, and/or the mode control signal MC, respectively.

The controller 180 may include and/or store test data 181 for the eye margin test. The test data 181 may include the same data as the analog input signal A_IN transmitted by the external transmitter (not shown), but the example embodiments are not limited thereto, and for example, the test data 181 may be random test data, generated test data, and/or preconfigured test data, etc. By adjusting the first delay control code DC1 and/or the second delay control code DC2, the controller 180 may determine, calculate, and/or obtain the first delay control code DC1 and/or the second delay control code DC2 (e.g., the length of delay for the clock signal and/or the digital input signal, etc.) which causes the number of sampling errors to be equal to or greater than a desired threshold (e.g., a desired error threshold, etc.). The controller 180 may obtain an eye margin code corresponding to an eye margin from the first delay control code DC1 and/or the second delay control code DC2 which causes the number of sampling errors is equal to or greater than the desired threshold. Meanwhile, according to at least one example embodiment of the inventive concepts, the number of sampling errors is measured for each sampling section, and the first delay control code DC1 and/or the second delay control code DC2 in the sampling section where the number of sampling errors is generated in excess of the desired threshold may be used to determine, calculate and/or obtain the eye margin code.

Specifically, the controller 180 may adjust the first delay control code DC1 (as illustrated later with reference to FIG. 2B, but not limited thereto) and then detect, sense, count, and/or obtain the number and/or amount of first sampling errors caused by the changes in the first delay control code DC1 by determining whether the sampling signal SAMP and the test data 181 do not match. In addition, the controller 180 may obtain and/or determine a first delay margin code from the first delay control code DC1 where the number of first sampling errors is equal to or greater than a desired first threshold.

In addition, the controller 180 may adjusting the second delay control code DC2 (as illustrated later with reference to FIG. 2C, but not limited thereto) and then detect, sense, count, and/or obtain the number and/or amount of second sampling errors caused by the changes in the second delay control code DC2 by determining whether the sampling signal SAMP and the test data 181 do not match. The controller 180 may obtain and/or determine a second delay margin code from the second delay control code DC2 where the number of second sampling errors is equal to or greater than a desired second threshold.

The desired first threshold and the desired second threshold may be set differently according to and/or based on a receiver design condition and/or requirements. In addition, the desired first threshold value and the desired second threshold value may be set to the same value, but may be set to different values according to one or more example embodiments.

The controller 180 may obtain and/or determine an eye margin code from the first delay margin code and/or the second delay margin code, as described later with reference to FIGS. 2D and 6, but is not limited thereto. The eye margin code measured by the controller 180 in the packet data section may be compared with the reference eye margin code REMC so that the good or bad of the measured eye margin may be effectively determined. For example, when the value of the reference eye margin code REMC is "32" and the eye margin code value is "16," the relative size of the eye margin code to the reference eye margin code REMC may be 0.5, etc. For example, when the eye margin code value corresponds to 0.1 ns, the eye margin of the delayed input signal DL_IN may be 0.05 ns, which is half of 0.1 ns, etc.

In some example embodiments, the controller 180 may estimate the timing skew of the digital input signal D_IN based on the digital input signal D_IN, and may compensate for the timing skew of the digital input signal D_IN by adjusting the second delay control code DC2, as described later with reference to FIG. 8B, but is not limited thereto.

The electronic apparatus 100 according to at least one example embodiment may test the eye margin of the delayed input signal DL_IN from the digital input signal D_IN and/or the recovery clock signal REC_CLK generated based on the digital input signal D_IN, etc.

In some example embodiments, the method for performing the eye margin test may be permanently or non-permanently deactivated after the test operation is completed.

FIGS. 2A to 2D are diagrams illustrating an eye margin test method, according to at least one example embodiment. FIGS. 2A to 2D may be described with reference to FIG. 1, but the example embodiments are not limited thereto.

Figure 2A:
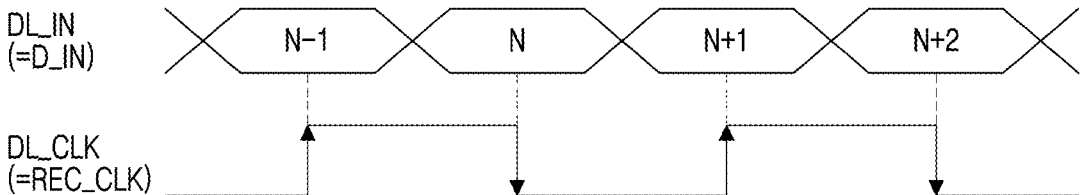
FIGS. 2A to 2D are diagrams illustrating an eye margin test method, according to at least one example embodiment.

FIG. 2A may indicate an initial state of the delayed input signal DL_IN and the delayed recovery clock signal DL_CLK. FIG. 2A illustrates a case in which the digital input signal D_IN and the recovery clock signal REC_CLK are not delayed, but the example embodiments are not limited thereto. In other words, the digital input signal D_IN and the delayed input signal DL_IN may have the same phase, etc. In addition, the recovery clock signal REC_CLK and the delayed recovery clock signal DL_CLK may have the same phase, etc.

Referring to FIG. 2A, the delayed input signal DL_IN may be sampled at the rising and falling edges of the delayed recovery clock signal DL_CLK, but is not limited thereto. As shown in FIG. 2A, according to and/or based on a rising edge and a falling edge of a delayed recovery clock signal DL_CLK, the sampling signals SAMP may be generated by respectively sampling (N–1)-th, N-th, (N+1)-th, and/or (N+2)-th delayed input signals DL_IN (where N is a natural number greater than or equal to 2), etc.

Referring to FIG. 1, the controller 180 may include test data 181 for an eye margin test. The test data 181 may have the same values as the (N–1)-th, N-th, (N+1)-th, and (N+2)-th delayed input signals DL_IN, but is not limited thereto. Therefore, when the digital input signal D_IN and the recovery clock signal REC_CLK are not delayed, the sampling signal SAMP and the test data 181 match.

Figure 2B:
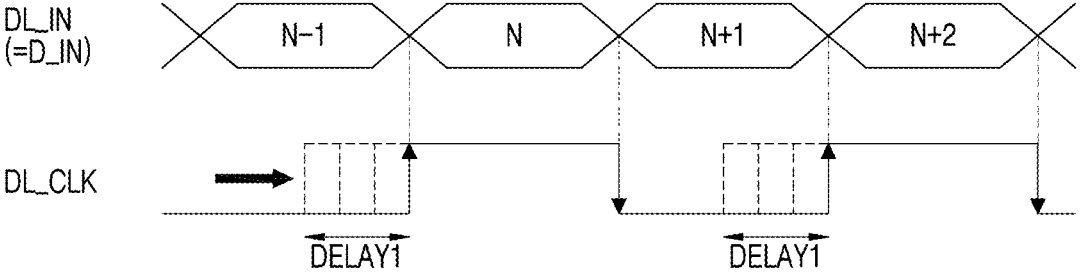

FIG. 2B is a diagram illustrating a method of obtaining a first delay margin code by adjusting a first delay control code DC1. FIG. 2B may illustrate a case in which the digital input signal D_IN is not delayed and only the recovery clock signal REC_CLK is delayed, but the example embodiments are not limited thereto.

As the first delay control code DC1 increases, the delay time of the recovery clock signal REC_CLK may increase. When the recovery clock signal REC_CLK is delayed for the first delay time DELAY1 time period or longer, the sampling signals SAMP sampled at the rising and falling edges of the delayed recovery clock signal DL_CLK and the test data 181 stored in the controller 180 may mismatch (e.g., do not match). In at least one example embodiment of the inventive concepts, the mismatch between the sampling signal SAMP and the test data 181 stored in the controller 180 may be referred to as a sampling error.

Meanwhile, the first delay control code DC1 is adjusted (e.g., changed) for each sampling section, and the delayed input signal DL_IN may be sampled a plurality of number of times using the delayed recovery clock signal DL_CLK according to and/or based on the adjusted first delay control code DC1, and the number of the sampling errors which occur for each delay value of the first delay control code DC1 may be counted. The value of a first delay control code DC1 in a specific sampling section which causes the number of sampling errors to be equal to or greater than a desired threshold value may be referred to as a first delay margin code.

Figure 2C:
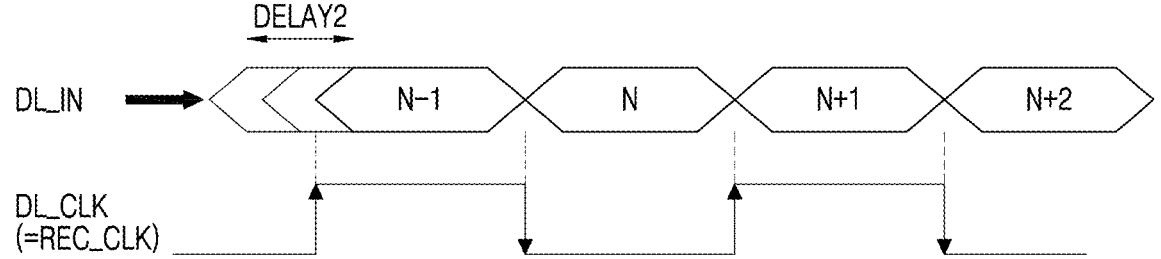

FIG. 2C is a diagram illustrating a method of obtaining a second delay margin code by adjusting a second delay control code DC2. FIG. 2C may illustrate a case in which the recovery clock signal REC_CLK is not delayed and only the digital input signal D_IN is delayed, but the example embodiments are not limited thereto. As the second delay control code DC2 increases, the delay time of the digital input signal D_IN may increase. When the digital input signal D_IN is delayed for the second delay time DELAY2 time period or longer, the sampling signals SAMP sampled at the rising and falling edges of the delayed recovery clock signal DL_CLK and the test data 181 stored in the controller 180 mismatch (e.g., do not match).

Meanwhile, the second delay control code DC2 is adjusted (e.g., changed) for each sampling section, and the delayed input signal DL_IN may be sampled a plurality of number of times using the delayed recovery clock signal DL_CLK according to the adjusted second delay control code DC2, and the number of the sampling errors may be counted. The value of a second delay control code DC2 in a specific sampling section which causes the number of sampling errors to be equal to or greater than a desired threshold value may be referred to as a second delay margin code.

Figure 2D:
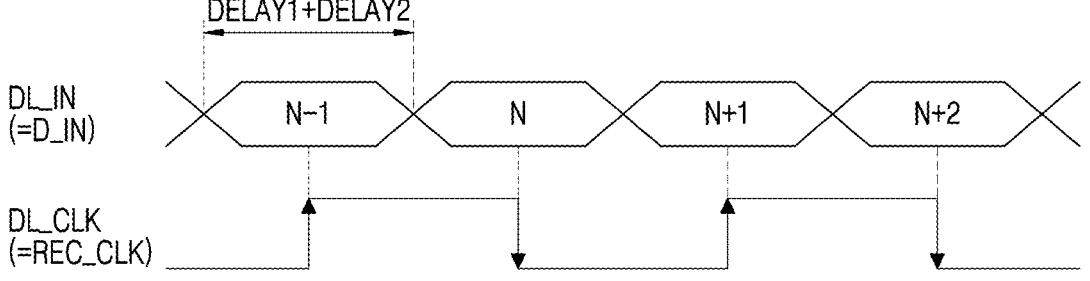

FIG. 2D may indicate a case in which the first delay control code DC1 and the second delay control code DC2 are initialized after the eye margin test, but the example embodiments are not limited thereto. In other words, the delayed input signal DL_IN and the delayed recovery clock signal DL_CLK shown in FIG. 2D may be the same as the delayed input signal DL_IN and the delayed recovery clock signal DL_CLK of FIG. 2A, respectively, but are not limited thereto. In addition, the time which is obtained by adding the first delay time DELAY1 described with reference to FIG. 2B and the second delay time DELAY2 described with reference to FIG. 2C are shown in FIG. 2D, but the example embodiments are not limited thereto. In addition, a code that is obtained by adding the first delay margin code and the second delay margin code may be referred to as an eye margin code.

Figure 3:
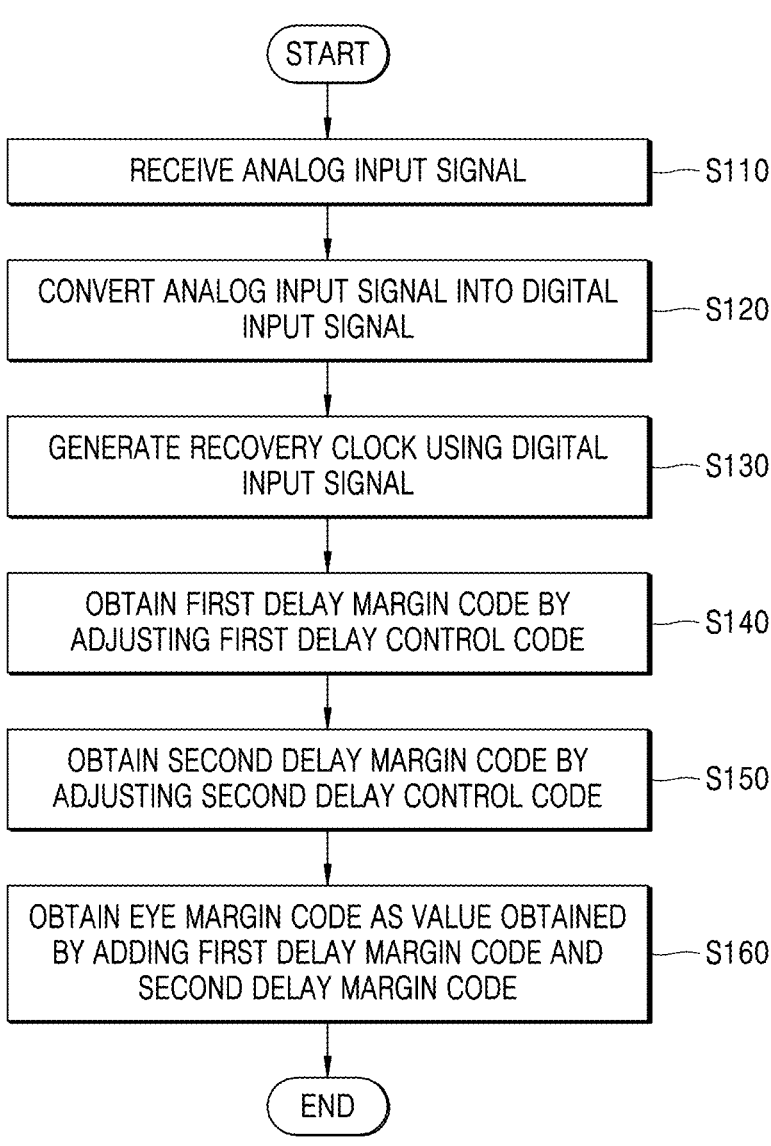
FIG. 3 is a flowchart illustrating an eye margin test method, according to at least one example embodiment.

FIG. 3 is a flowchart illustrating an eye margin test method, according to at least one example embodiment. FIG. 3 may be described with reference to FIGS. 1 to 2D, but the example embodiments are not limited thereto.

Referring to FIG. 3, the eye margin test method may include operations S110 to S160, but is not limited thereto.

In operation S110, the analog input signal A_IN may be received by the processing circuitry of the electronic apparatus 100. The analog input signal A_IN may refer to a signal transmitted from an external transmitter (not shown), etc.

In some example embodiments, the analog input signal A_IN may be a three-phase signal including a first sub-signal, a second sub-signal, and a third sub-signal, but is not limited thereto. For example, the analog input signal A_IN may be a signal generated according to the C-PHY interface protocol, but is not limited thereto. According to the C-physical layer (C-PHY) interface protocol, each of the first sub-signal, the second sub-signal, and the third sub-signal may have any one of a high voltage level, a mid voltage level, and a low voltage level.

In operation S120, the processing circuitry of the electronic apparatus 100 may convert the analog input signal A_IN into the digital input signal D_IN. For example, when the analog input signal A_IN is a signal generated according to the C-PHY interface protocol, the analog input signal A_IN may be converted into a digital input signal D_IN based on a voltage level difference between the first, second, and third sub-signals, but the example embodiments are not limited thereto.

For example, the digital input signal D_IN may include a first digital input signal to a third digital input signal, etc. The first digital input signal may have a value of "1" when the voltage level of the first sub-signal is greater than the voltage level of the second sub-signal, and may have a value of "0" when the voltage level of the first sub-signal is lower than the voltage level of the second sub-signal, but is not limited thereto.

The second digital input signal may have a value of "1" when the voltage level of the second sub-signal is greater than the voltage level of the third sub-signal, and may have a value of "0" when the voltage level of the second sub-signal is lower than the voltage level of the third sub-signal, but is not limited thereto.

The third digital input signal may have a value of "1" when the voltage level of the third sub-signal is greater than the voltage level of the first sub-signal, and may have a value of "0" when the voltage level of the third sub-signal is lower than the voltage level of the first sub-signal, but is not limited thereto.

In operation S130, the processing circuitry of the electronic apparatus 100 may generate the recovery clock signal REC_CLK using the digital input signal D_IN. For example, as shown in FIG. 1, the recovery clock signal REC_CLK may be generated using the digital input signal D_IN and/or the delayed input signal DL_IN output by the selector 120, etc. In the recovery clock signal REC_CLK, the edge of the clock signal may be positioned in the center of the digital input signal D_IN and/or the delayed input signal DL_IN, etc. In some example embodiments, the recovery clock signal REC_CLK may be generated by a clock signal and data recovery (CDR) circuit that restores the clock signal and/or data based on the output of the selector 120, but is not limited thereto.

In operation S140, the processing circuitry of the electronic apparatus 100 may adjust the first delay control code DC1 and may obtain a first delay margin code based on the adjusted first delay control code DC1. For example, the processing circuitry of the electronic apparatus 100 determine the value of the first delay control code DC1 which causes the number of first sampling errors to be equal to or greater than a first threshold value. The first sampling error(s) are instances when the signal obtained by sampling the delayed input signal DL_IN and the test data 181 do not match, wherein the delayed input signal DL_IN is sampled based on the delayed recovery clock signal DL_CLK and the delayed recovery clock signal DL_CLK is generated based on the first delay control code DC1. Referring to FIG. 2B, when the delayed recovery clock signal DL_CLK is delayed for the first delay time DELAY1 time period or longer, the sampling signal SAMP and the test data 181 mismatch. The first delay control code DC1 which causes the first sampling error is more than or equal to the first threshold value may be referred to as a first delay margin code.

In operation S150, the processing circuitry of the electronic apparatus 100 obtains the second delay margin code by adjusting the second delay control code DC2. The second delay margin code corresponds to the value of the second delay margin which causes the number of the second sampling errors to be equal to or greater than the second threshold. The second sampling error(s) are instances when the sampling signal SAMP obtained by sampling the delayed input signal DL_IN and the test data 181 do not match, wherein the delayed input signal DL_IN is sampled based on the second delay control code DC2. When the delayed recovery clock signal DL_CLK is delayed for the second delay time DELAY2 time period or longer, the sampling signal SAMP and the test data 181 mismatch. The second delay control code DC2 in which the second sampling error is equal to or greater than the second threshold value may be referred to as a second delay margin code.

In operation S160, the processing circuitry of the electronic apparatus 100 obtains an eye margin code from the first delay margin code and the second delay margin code. The eye margin code may refer to a code obtained by adding the first delay margin code and the second delay margin code, but is not limited thereto. In addition, the delay time corresponding to the eye margin code may be referred to as the eye margin.

In some example embodiments, the eye margin test method may further include the processing circuitry of the electronic apparatus 100 determining whether the electronic apparatus is defective based on the eye margin code. The determination result based on the eye margin code may be used to design an electronic apparatus, such as a receiver, a transmitter, a transceiver, a peripheral device, a storage device, an input/output device, etc.

Figure 4:
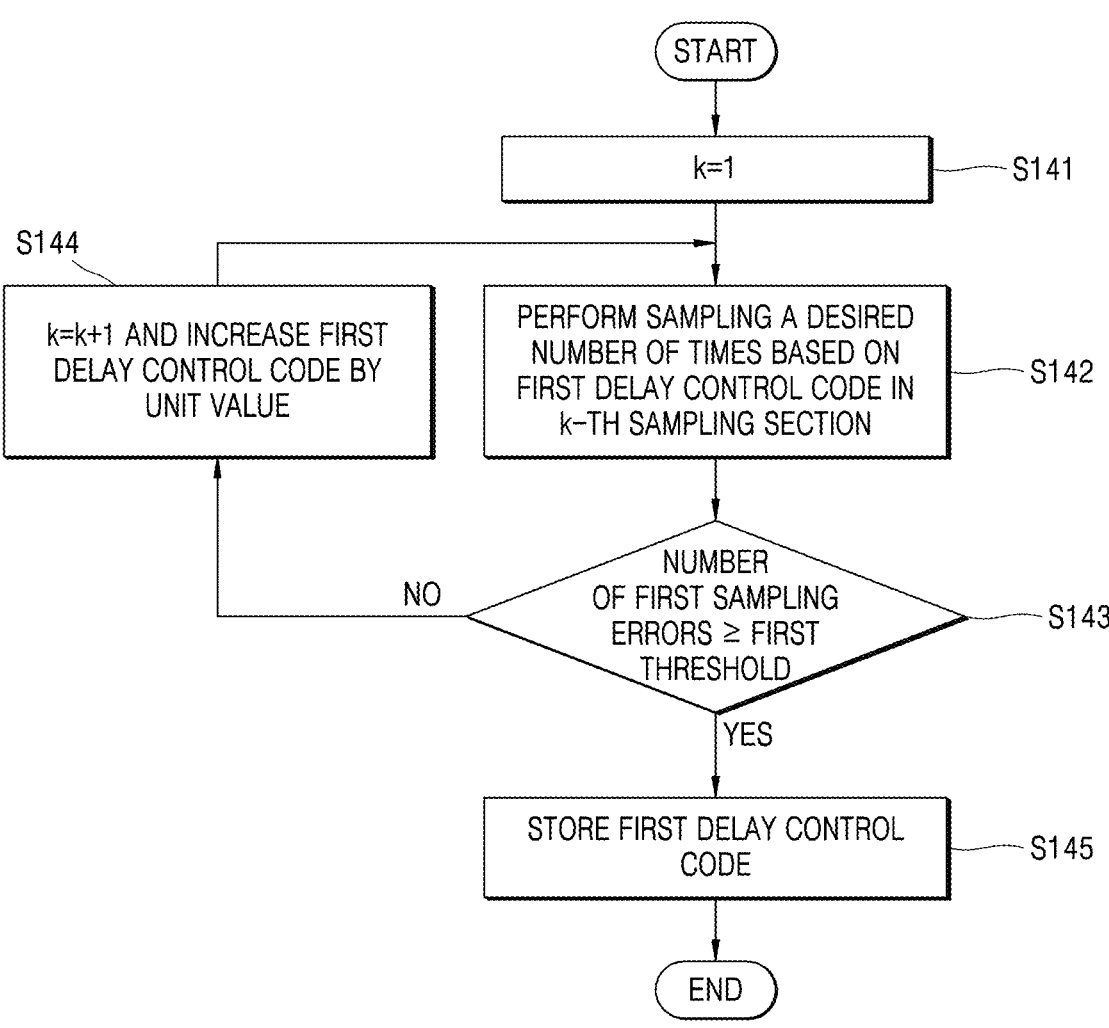
FIG. 4 is a flowchart illustrating a method of obtaining a first delay margin code, according to at least one example embodiment.

FIG. 4 is a flowchart illustrating a method of obtaining a first delay margin code, according to at least one example embodiment. FIG. 4 may be described with reference to FIGS. 1 and 3, but the example embodiments are not limited thereto.

The method of obtaining the first delay margin code may include operations S141 to S144, but is not limited thereto.

In operation S141, the processing circuitry of the electronic apparatus 100 may initialize a sampling section index k to 1, but is not limited thereto. A plurality of sampling sections may exist in a single data packet section, but the example embodiments are not limited thereto.

In operation S142, the processing circuitry of the electronic apparatus 100 may perform a desired number of samplings based on the first delay control code DC1 in the k-th sampling section. For example, as described above with reference to FIG. 1, the deserializer 160 may generate the sampling signals SAMP by sampling the delayed input signal DL_IN at the rising and falling edges of the delayed recovery clock signal DL_CLK, but the example embodiments are not limited thereto.

In operation S143, the processing circuitry of the electronic apparatus 100 may determine whether the number of first sampling errors is equal to or greater than the first threshold value. The number of first sampling errors may be counted by determining whether the sampling signal SAMP matches the test data 181. In other words, when the sampling signal SAMP does not match the test data 181, the processing circuitry of the electronic apparatus 100 may determine that a first sampling error has occurred. When the number of first sampling errors is less than the first threshold, operation S144 may be performed. Meanwhile, when the number of first sampling errors is equal to or greater than the first threshold value, operation S145 may be performed.

In operation S144, the processing circuitry of the electronic apparatus 100 may increase the sampling section index by 1 (e.g., may increment the sampling section index). In addition, the processing circuitry of the electronic apparatus 100 may also increment the first delay control code DC1 by a unit value. When the first delay control code DC1 increases by a unit value (e.g., is incremented), the delay time of the delayed recovery clock signal DL_CLK may also increase by a unit time (e.g., a desired unit of time interval, etc.). In other words, in operation S144, the processing circuitry of the electronic apparatus 100 may generate a delayed recovery clock signal DL_CLK delayed by a unit time. However, the second delay control code DC2 may be an initial value. In other words, the digital input signal D_IN and the delayed input signal DL_IN may have the same phase, but are not limited thereto.

In operation S145, the processing circuitry of the electronic apparatus 100 may store the first delay control code DC1. The first delay control code DC1 stored in operation S145 may be a case in which the number of first sampling errors is greater than or equal to a first threshold value, but is not limited thereto. The first delay control code DC1 stored in operation S145 may be referred to as a first delay margin code.

Figure 5:
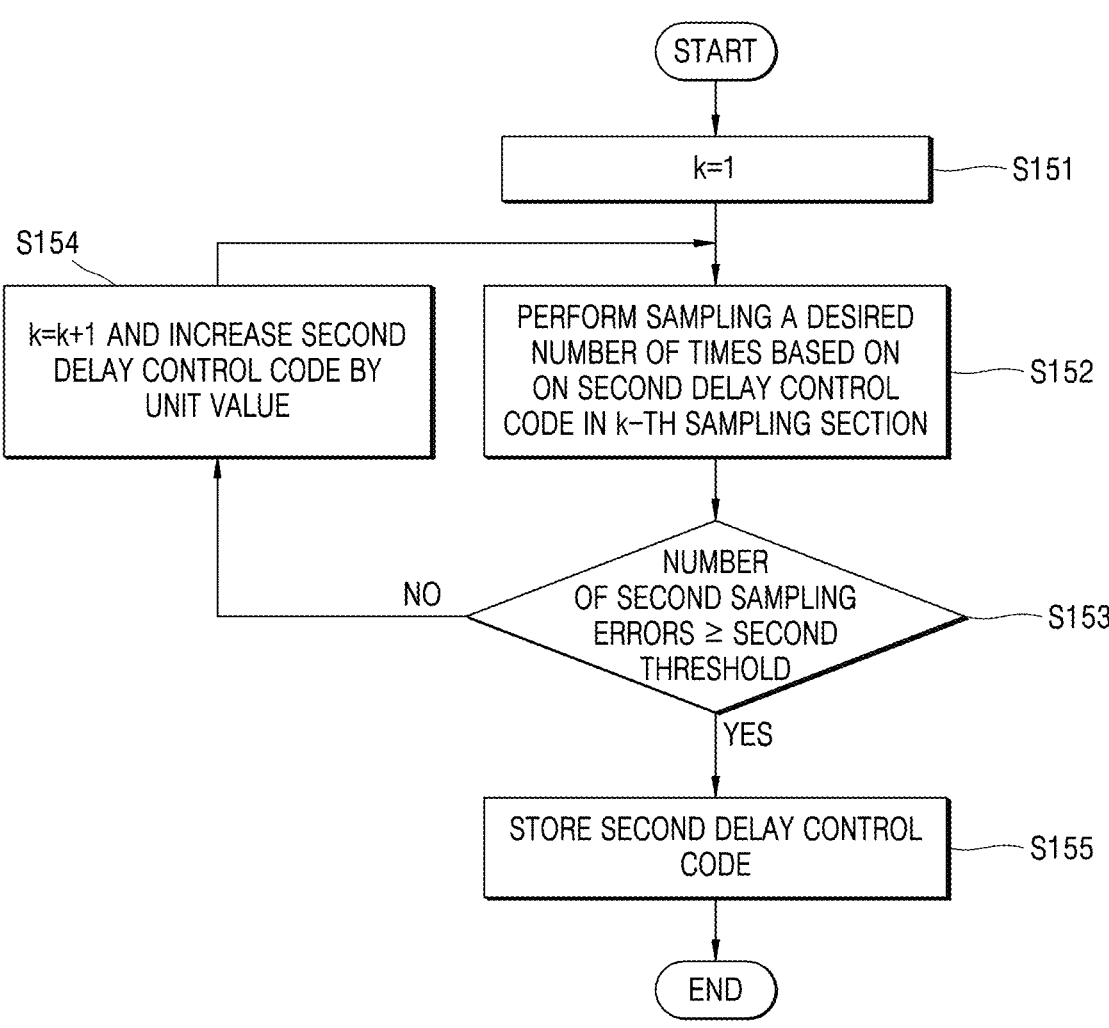
FIG. 5 is a flowchart illustrating a method of obtaining a second delay margin code, according to at least one example embodiment.

FIG. 5 is a flowchart illustrating a method of obtaining a second delay margin code according to at least one example embodiment.

The method of obtaining the second delay margin code may include operations S151 to S154, but the example embodiments are not limited thereto.

In operation S151, the processing circuitry of the electronic apparatus 100 may initialize a sampling section index k to 1. A plurality of sampling sections may exist in a single data packet section, but the example embodiments are not limited thereto.

In operation S152, the processing circuitry of the electronic apparatus 100 may perform sampling a desired numbers of times based on the second delay control code DC2 in the k-th sampling section. For example, as described above with reference to FIG. 1, the deserializer 160 may generate the sampling signals SAMP by sampling the delayed input signal DL_IN at the rising and falling edges of the delayed recovery clock signal DL_CLK, but the example embodiments are not limited thereto.

In operation S153, the processing circuitry of the electronic apparatus 100 may determine whether the number of second sampling errors is equal to or greater than the second threshold value. The number of second sampling errors may be counted and/or determined by the processing circuitry of the electronic apparatus 100 by determining whether the sampling signal SAMP matches the test data 181.

In other words, when the sampling signal SAMP does not match the test data 181, the processing circuitry of the electronic apparatus 100 may determine that a second sampling error has occurred. When the number of second sampling errors is less than the second threshold, operation S154 may be performed. Meanwhile, when the number of second sampling errors is equal to or greater than the second threshold value, operation S155 may be performed.

In operation S154, the processing circuitry of the electronic apparatus 100 may increase the sampling section index by 1 (e.g., may increment the sampling section index, etc.). In addition, the processing circuitry of the electronic apparatus 100 may increase the second delay control code DC2 by a unit value (e.g., by a desired unit, etc.). When the second delay control code DC2 increases by a unit value, the processing circuitry of the electronic apparatus 100 may increase the delay time of the delayed input signal DL_IN by a unit time (e.g., by a desired interval of time, by a unit of time interval, etc.). In other words, in operation S154, a delayed input signal DL_IN delayed by unit time may be generated by the processing circuitry of the electronic apparatus 100 may increase. However, the first delay control code DC1 may be an initial value. In other words, the recovery clock signal REC_CLK and the delayed recovery clock signal DL_CLK may have the same phase.

In operation S155, the processing circuitry of the electronic apparatus 100 may increase may store the second delay control code DC2. The second delay control code DC2 stored in operation S155 may be a case in which the number of second sampling errors is greater than or equal to a second threshold value. The second delay control code DC2 stored in operation S155 may be referred to as a second delay margin code.

FIG. 6 is a diagram illustrating a method of obtaining an eye margin code, according to at least one example embodiment.

FIG. 6 shows the number of times of occurrence of sampling errors in the sampling section when the first delay control code DC1 is increased and the number of times of occurrence of sampling errors in the sampling section when the second delay control code DC2 is increased, but the example embodiments are not limited thereto. FIG. 6 illustrates, as an example, a case where both the first threshold and the second threshold are 1, but the first threshold and the second threshold may be set differently according to some example embodiments.

As shown in FIG. 6, a sampling error may occur once in a sampling section in which the first delay control code DC1 is increased by "3." Accordingly, "2" which is the maximum first delay control code DC1 in which no sampling error occurs may be the first delay margin code, but the example embodiments are not limited thereto.

In addition, a sampling error may occur once in a sampling section in which the second delay control code DC2 is increased by "5." Accordingly, "4" which is the maximum second delay control code DC2 in which no sampling error occurs may be the second delay margin code, but the example embodiments are not limited thereto.

The eye margin code may be a code obtained by adding the first delay margin code and the second delay margin code. Accordingly, the value of the eye margin code may be "6" which is obtained by adding the first delay margin code value of "2" and the second delay margin code value of "4," but the example embodiments are not limited thereto.

Figure 7:
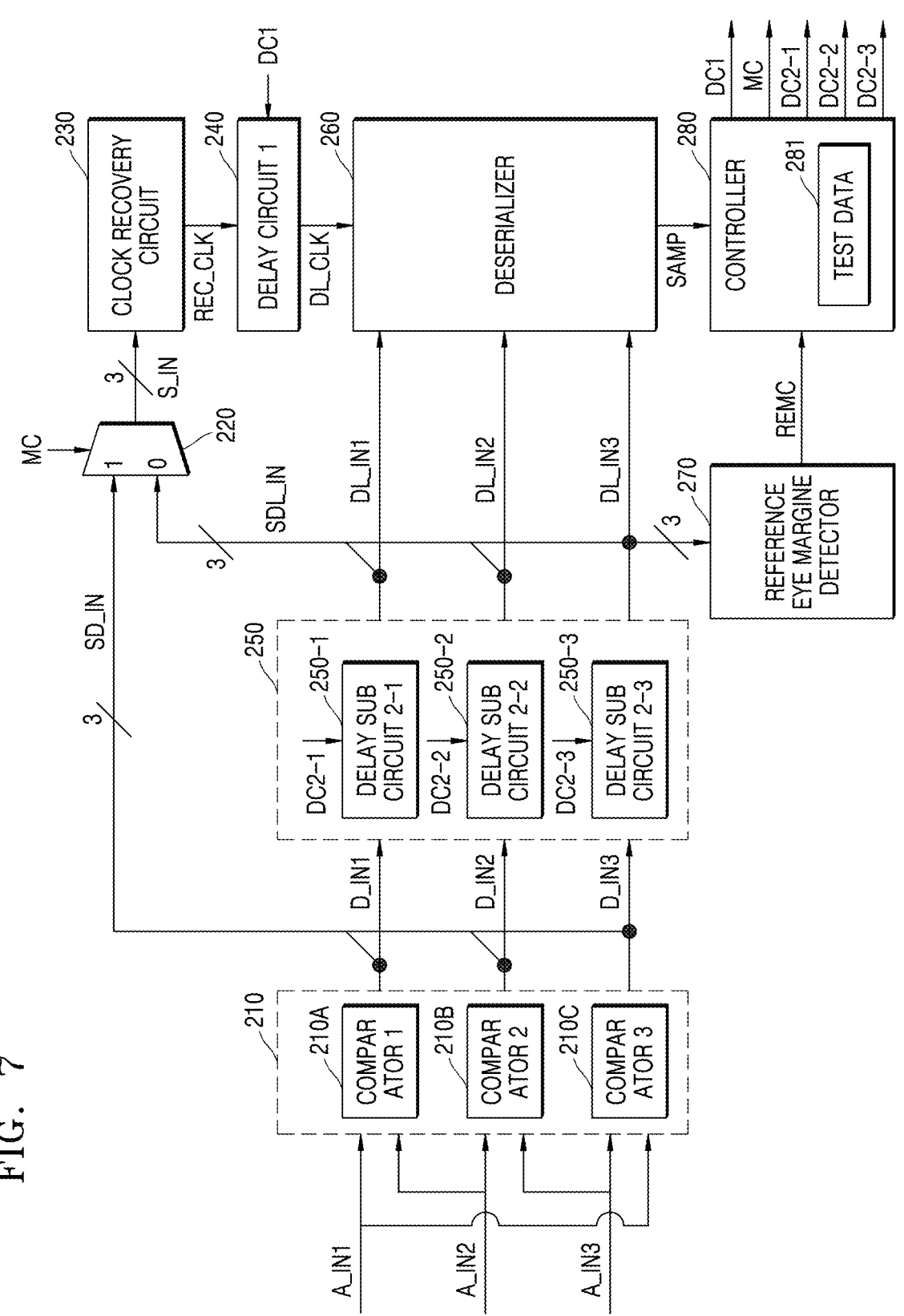
FIG. 7 is a block diagram specifically illustrating an electronic apparatus, according to at least one example embodiment.

FIG. 7 is a block diagram specifically illustrating an electronic apparatus according to at least one example embodiment.

The electronic apparatus may include an interface circuit 210, a selector 220, a clock signal recovery circuit 230, a first delay circuit 240, a second delay circuit 250, a deserializer 260, a reference eye margin detector 270, and/or a controller 280, etc., but is not limited thereto. According to some example embodiments, the interface circuit 210, the selector 220, the clock signal recovery circuit 230, the first delay circuit 240, the second delay circuit 250, the deserializer 260, the reference eye margin detector 270, and/or the controller 280, etc., may be implemented as processing circuitry. Processing circuitry may include hardware or hardware circuit including logic circuits; a hardware/software combination such as a processor executing software and/or firmware; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc., but is not limited thereto.

The interface circuit 210 may receive at least one analog input signal A_IN and convert the analog input signal A_IN into at least one digital input signal D_IN. The analog input signal A_IN may refer to a signal transmitted by an external transmitter (not shown).

In some example embodiments, the analog input signal A_IN may be a three-phase signal including a first sub-signal A_IN1, a second sub-signal A_IN2, and a third sub-signal A_IN3, but the example embodiments are not limited thereto. For example, the analog input signal A_IN may be a signal generated according to the C-physical layer (C-PHY) interface protocol, but is not limited thereto. According to the C-PHY interface protocol, each of the first sub-signal A_IN1, the second sub-signal A_IN2, and the third sub-signal A_IN3 may have one of a high voltage level, a mid voltage level, and a low voltage level, but the example embodiments are not limited thereto.

The interface circuit 210 may include a plurality of comparators, e.g., a first comparator 210A, a second comparator 210B, and/or a third comparator 210C, but is not limited thereto. In addition, the interface circuit 210 may convert the analog input signal A_IN into a digital input signal based on the voltage level difference between the first sub-signal A_IN1, the second sub-signal A_IN2, and/or the third sub-signal A_IN3, etc.

When the voltage level of the first sub-signal A_IN1 is greater than the voltage level of the second sub-signal A_IN2, the first comparator 210A may output a first digital input signal D_IN1 having a value of "1", but is not limited thereto. Meanwhile, when the voltage level of the first sub-signal A_IN1 is lower than the voltage level of the second sub-signal A_IN2, the first comparator 210A may output a first digital input signal D_IN1 having a value of "0", but is not limited thereto.

The second comparator 210B may output a second digital input signal D_IN2 having a value of "1" when the voltage level of the second sub-signal A_IN2 is greater than the voltage level of the third sub-signal A_IN3, etc. Meanwhile, when the voltage level of the second sub-signal A_IN2 is lower than the voltage level of the third sub-signal A_IN3, the second comparator 210B may output a second digital input signal D_IN2 having a value of "0", etc.

The third comparator 210C may output a third digital input signal D_IN3 having a value of "1" when the voltage level of the third sub-signal A_IN3 is greater than the voltage level of the first sub-signal A_IN1, etc. Meanwhile, the third comparator 210C may output a third digital input signal D_IN3 having a value of "0" when the voltage level of the third sub-signal A_IN3 is lower than the voltage level of the first sub-signal A_IN1, etc.

The second delay circuit 250 may include a (2-1)-th delay sub-circuit 250-1, a (2-2)-th delay sub-circuit 250-2, and/or a (2-3)-th delay sub-circuit 250-3, etc., but is not limited thereto. Each of the delay sub-circuits 250-1, 250-2, and/or 250-3 may be operated under the control of the delay control codes DC2-1, DC2-2, and/or DC2-3 generated by the controller 280, but is not limited thereto. Specifically, the (2-1)-th delay sub-circuit 250-1 may generate a first delayed input signal DL_IN1 delayed from the first digital input signal D_IN1 according to the (2-1)-th delay control code DC2-1. Similarly, the (2-2)-th delay sub-circuit 250-2 may generate a second delayed input signal DL_IN2 delayed from the second digital input signal D_IN2 according to the (2-2)-th delay control code DC2-2. In addition, the (2-3)-th delay sub-circuit 250-3 may generate a third delayed input signal DL_IN3 delayed from the third digital input signal D_IN3 according to the (2-3)-th delay control code DC2-3.

The selector 220 may receive a sum digital input signal SD_IN, which is a signal obtained by adding a first digital input signal D_IN1 to a third digital input signal D_IN3, and a summed delayed input signal SDL_IN, which is a signal obtained by adding a first delayed input signal DL_IN to a third delayed input signal DL_IN3, and may output any one of the summed digital input signal SD_IN and the summed delayed input signal SDL_IN under the control of a mode control signal MC, but is not limited thereto. For example, when the mode control signal MC has a value of "1" corresponding to an eye margin test mode or a dual mode, the selector 220 may output the summed digital input signal SD_IN under the control of the mode control signal MC, but is not limited thereto. Meanwhile, when the mode control signal MC has a value of "0" corresponding to a skew compensation mode, the selector 220 may output the summed delayed input signal SDL_IN under the control of the mode control signal MC, but is not limited thereto.

The clock signal recovery circuit 230 may generate the recovery clock signal REC_CLK based on the output S_IN of the selector 220. In other words, the clock signal recovery circuit 230 may recover a clock signal corresponding to the phase and/or frequency of the summed digital input signal SD_IN and/or the summed delayed input signal SDL_IN output by the selector 220. Specifically, the clock signal recovery circuit 230 may generate recovery clock signal REC_CLK so that the edge of the clock signal is located in the center of the summed digital input signal SD_IN and/or the summed delayed input signal SDL_IN, etc. In some example embodiments, the clock signal recovery circuit 230 may be a clock signal and data recovery (CDR) circuit that restores clock signal and/or data based on the output S_IN of the selector.

The first delay circuit 240 may generate a delayed recovery clock signal DL_CLK from the recovery clock signal REC_CLK under the control of the first delay control code DC1. The first delay circuit 240 may generate the delayed recovery clock signal DL_CLK from the recovery clock signal REC_CLK that has been delayed for a length of time corresponding to the first delay control code DC1.

The deserializer 260 may generate a sampling signal SAMP based on the first delayed input signal DL_IN1 to the third delayed input signal DL_IN3 and the delayed recovery clock signal DL_CLK. In other words, the deserializer 260 may generate a sampling signal SAMP by sampling the first delayed input signal DL_IN1 to the third delayed input signal DL_IN3 at the rising edge or falling edge of the delayed recovery clock signal DL_CLK, etc., but is not limited thereto.

The controller 280 may generate a first delay control code DC1, a mode control signal MC, a (2-1)-th delay control code DC2-1, a (2-2)-th delay control code DC2-2, and/or a (2-3)-th delay control code DC2-3, etc. The controller 280 may control the first delay circuit 240, the (2-1)-th delay sub-circuit 250-1, the (2-2)-th delay sub-circuit 250-2, the (2-3)-th delay sub-circuit 250-3, and/or the selector 220 by adjusting the first delay control code DC1, the mode control signal MC, the (2-1)-th delay control code DC2-1, the (2-2)-th delay control code DC2-2, and/or the (2-3)-th delay control code DC2-3, respectively.

The controller 280 may include test data 281 for the eye margin test. The test data 281 may include the same data as the analog input signal A_IN transmitted from the external transmitter (not shown), but is not limited thereto.

The controller 280 may obtain and/or determine delay margin codes corresponding to a time when a number of sampling error occurring is equal to or greater than a desired threshold by adjusting each delay control code, as described above with reference to FIGS. 2A to 6, but the example embodiments are not limited thereto. The controller may obtain an eye margin code corresponding to the eye margin from the delay margin codes. In addition, the controller 280 may estimate the timing skew of the first digital input signal D_IN1 to the third digital input signal D_IN3 from the sampling signal SAMP, and compensate for the timing skew of the first digital input signal D_IN1 to the third digital input signal by adjusting the (2-1)-th delay control code DC2-1 to the (2-3)-th delay control code DC2-3, etc.

The reference eye margin detector 270 may detect a reference clock signal from a first delayed input signal DL_IN1 to a third delayed input signal DL_IN3 having a first frequency pulse waveform. For example, the first delayed input signal DL_IN1 to the third delayed input signal DL_IN3 may be signals generated according to the C-PHY interface protocol, but the example embodiments are not limited thereto. The first delayed input signal DL_IN1 to the third delayed input signal DL_IN3 may include a pre-amble signal having the first frequency pulse waveform, etc.

The reference eye margin detector 170 may generate a reference clock signal having a pulse waveform of a second frequency higher than the first frequency based on the preamble signal. In addition, the reference eye margin detector 270 may generate a code corresponding to half of a cycle (e.g., a half-duty cycle, etc.) of the second frequency pulse using the second frequency and/or the operating speed of the electronic apparatus, but is not limited thereto. For example, when the electronic apparatus operates at a speed of 10 Gps, the half cycle of the second frequency pulse may be 0.1 ns, which is the reciprocal of 10 Gps. Here, the code corresponding to the half cycle of the second frequency pulse may be referred to as a reference eye margin code REMC or a unit interval (UI) code. The reference eye margin code REMC may be used to measure the magnitude and/or absolute magnitude of the eye margin in the controller 280.

The controller 280 may measure the size and/or the absolute size of the eye margin by comparing the reference eye margin code REMC with the eye margin code. For example, when the value of the reference eye margin code REMC is "32" and the eye margin code value is "16," the relative size of the eye margin code to the reference eye margin code REMC may be 0.5 (e.g., 16/32), but the example embodiments are not limited thereto. Accordingly, the eye margin of the delayed input signals may be 0.05 ns, which is half of 0.1 ns, etc.

In FIG. 7, the reference eye margin detector 270 has been illustrated as a separate component from the controller 280, but in some example embodiments, the reference eye margin detector 270 may be a component of the controller 280 and/or the controller 280 may perform the functions of the reference eye margin detector 270, etc.

The electronic apparatus according to at least one example embodiment may test the eye margin of the digital input signals D_IN1, D_IN2, and D_IN3 using the recovery clock signal REC_CLK generated based on the digital input signals D_IN1, D_IN2, and D_IN3, but the example embodiments are not limited thereto. In addition, the electronic apparatus may measure the absolute size of the eye margin by comparing the reference eye margin code REMC with the eye margin of the digital input signals D_IN1, D_IN2, and D_IN3.

FIGS. 8A to 8D are timing diagrams of signals of an electronic apparatus, over time, according to at least one example embodiment. FIGS. 8A to 8D may be described with reference to FIG. 7, but is not limited thereto. Specifically, FIGS. 8A to 8D illustrate the first digital input signal D_IN1, the second digital input signal D_IN2, the third digital input signal D_IN3, the summed combined digital input signal SD_IN, the output S_IN of the selector, the summed delayed input signal SDL_IN, and the recovery clock signal REC_CLK of FIG. 7, but the example embodiments are not limited thereto.

Figure 8A:
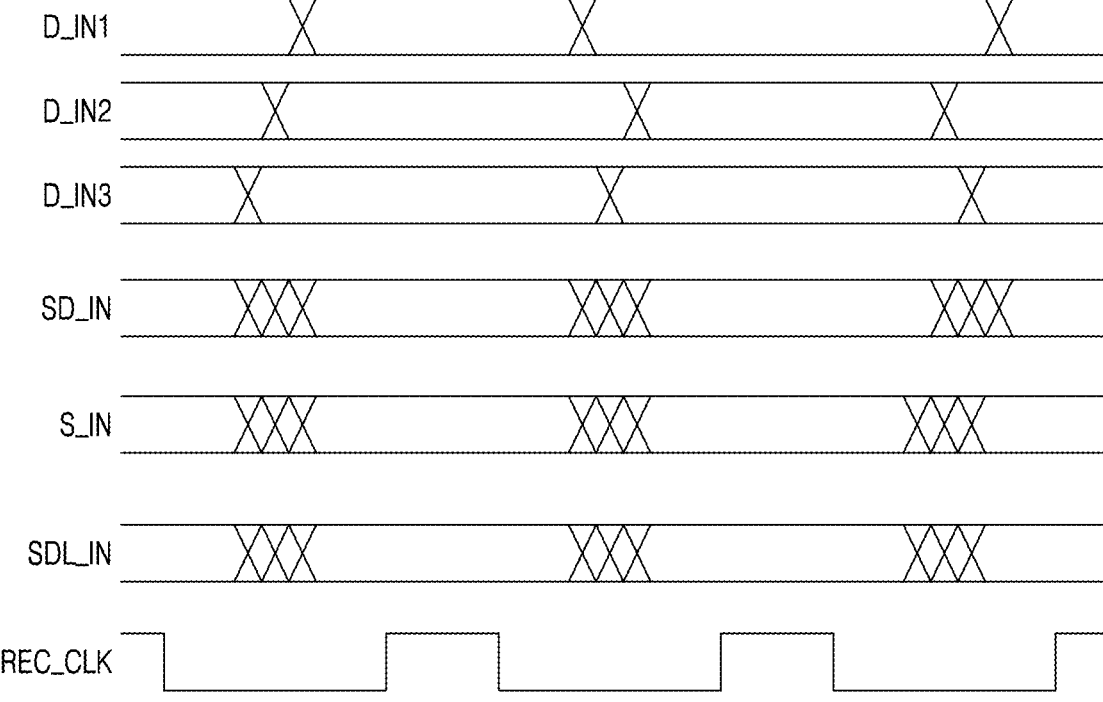
FIGS. 8A to 8D are timing diagrams of signals of an electronic apparatus, over time, according to at least one example embodiment.

FIG. 8A is a timing diagram of signals over time in an electronic apparatus in a normal mode in which an eye margin test operation and/or a skew compensation operation have not been performed. Referring to FIG. 7, a first delay control code DC1, a (2-1)-th delay control code DC2-1, a (2-2)-th delay control code DC2-2, and/or a (2-3)-th delay control code DC2-3 in a normal mode may be initial values, etc. In other words, the normal mode may refer to a case in which there is no delay between the digital input signals D_IN1, D_IN2, and D_IN3, etc., and the recovery clock signal REC_CLK. Since the digital input signals D_IN1, D_IN2, and D_IN3 and the delayed input signals DL_IN1, DL_IN2, and DL_IN3 have the same phase, the mode control signal MC may have either a value of "1" value or a value of "0."

Figure 8B:
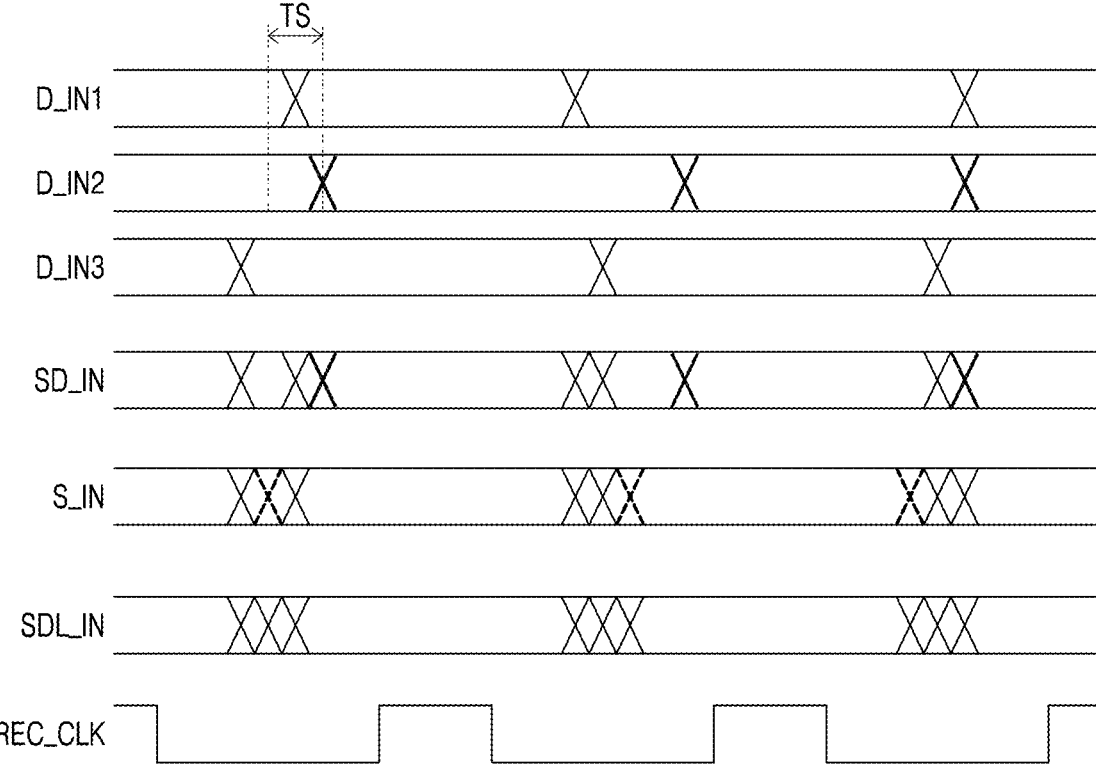

FIG. 8B is a timing diagram of signals over time in an electronic apparatus in a skew compensation mode for performing skew compensation.

In some example embodiments, the electronic apparatus may compensate for the timing skew of the digital input signals D_IN1, D_IN2, and/or D_IN3, etc. Specifically, the electronic apparatus may estimate the timing skew of the digital input signals D_IN1, D_IN2, and/or D_IN3, etc., based on the digital input signals D_IN1, D_IN2, and/or D_IN3, etc. In addition, the (2-1)-th delay control code DC2-1, the (2-2)-th delay control code DC2-2 and/or the (2-3)-th delay control code DC2-3, etc., may be controlled to compensate for the timing skew of each of the digital input signals D_IN1, D_IN2, and/or D_IN3, etc.

FIG. 8B illustrates that timing skew is generated by the skew time TS in the second digital input signal D_IN2. The controller 280 may compensate for the timing skew of the second digital input signal D_IN2 by adjusting the (2-2)-th delay control code DC2-2, but is not limited thereto. In addition, the electronic apparatus may store a value of the (2-2)-th delay control code DC2-2 for compensating for the timing skew. Here, the values of the (2-1)-th delay control code DC2-1, the (2-2)-th delay control code DC2-2 and/or the (2-3)-th delay control code DC2-3 compensate for timing skew and may be referred to as skew compensation offset codes.

Figure 8C:
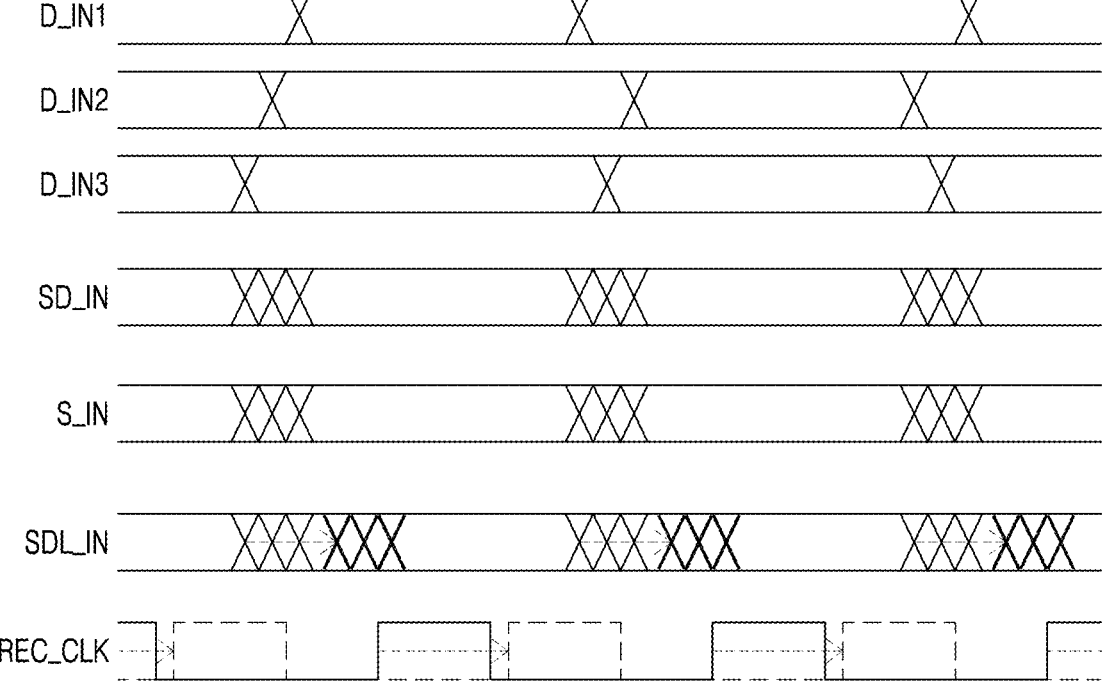

FIG. 8C is a timing diagram of signals over time in an electronic device in an eye margin test mode. As described above with reference to FIGS. 1 to 7, the electronic apparatus may obtain an eye margin code corresponding to an eye margin by adjusting the first delay control code DC1, the (2-1)-th delay control code DC2-1, the (2-2)-th delay control code DC2-2, and/or the (2-3)-th delay control code DC2-3, etc.

Figure 8D:
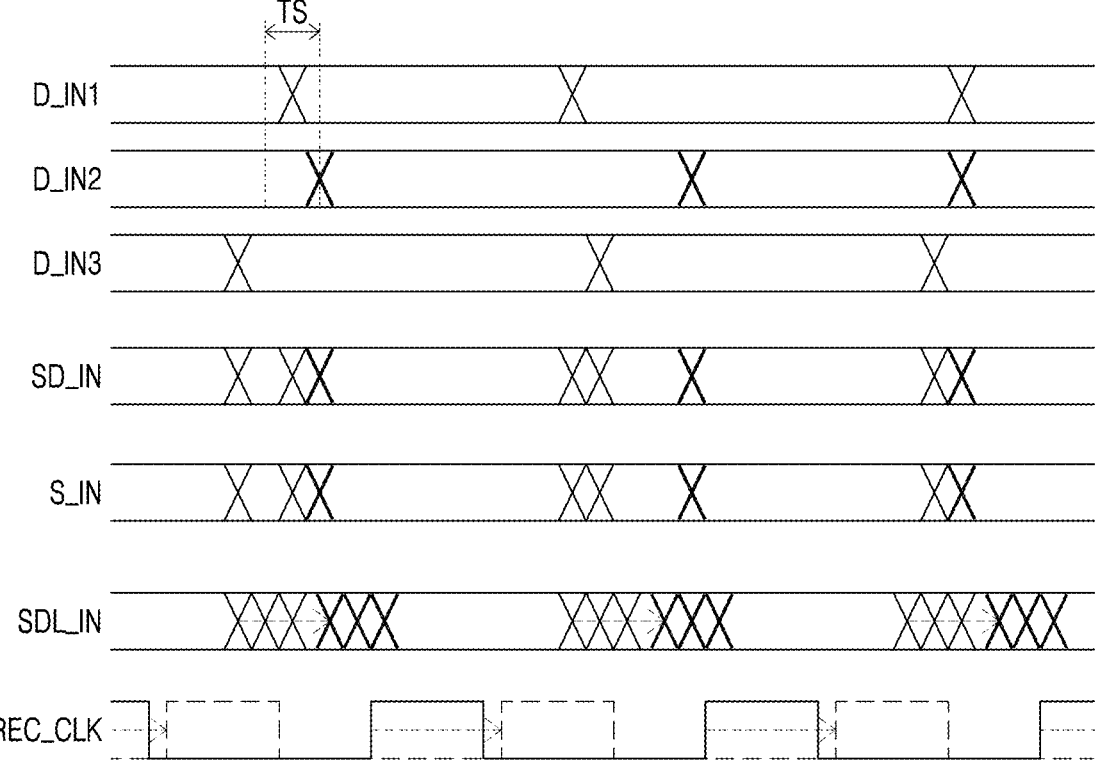

FIG. 8D is a timing diagram of signals over time in an electronic apparatus in a dual mode in which both an eye margin test and skew compensation are performed. The electronic apparatus may use, in the dual mode, a skew compensation offset code value stored in the skew mode. Specifically, the initial values of the (2-1)-th delay control code DC2-1, the (2-2)-th delay control code DC2-2, and/or the (2-3)-th delay control code DC2-3, etc., may be set as skew compensation offset code values.

Afterwards, in the dual mode, the electronic apparatus may obtain an eye margin code corresponding to the eye margin by adjusting the first delay control code DC1, the (2-1)-th delay control code DC2-1, the (2-2)-th delay control code DC2-2, and/or the (2-3)-th delay control code DC2-3, etc.

Figure 9:
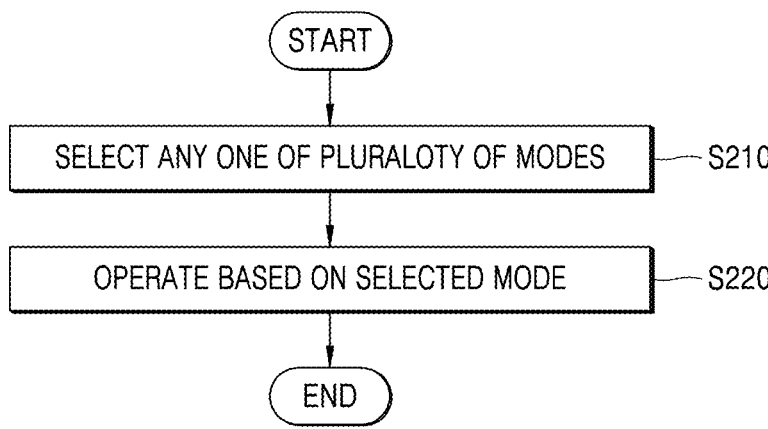
FIG. 9 is a flowchart illustrating a method of operating an electronic apparatus, according to at least one example embodiment.

FIG. 9 is a flowchart illustrating a method of operating an electronic apparatus according to at least one example embodiment. FIG. 9 may be described with reference to FIGS. 7 to 8D, but the example embodiments are not limited thereto.

The method of operating the electronic apparatus may include operations S210 and S220, but is not limited thereto.

In operation S210, the electronic apparatus may select any one of a plurality of modes. The plurality of modes may include a normal mode, a skew compensation mode, an eye margin test mode, and/or a dual mode as described above with reference to FIGS. 8A to 8D, but the example embodiments are not limited thereto. Depending on which of the modes has been selected, the first delay control code DC1, the mode control signal MC, the (2-1)-th delay control code DC2-1, the (2-2)-th delay control code DC2-2, and/or the (2-3)-th delay control code DC2-3 may be adjusted differently.

In operation S220, an operation may be performed according to the mode selected in step S210, but is not limited thereto.

Figure 10:
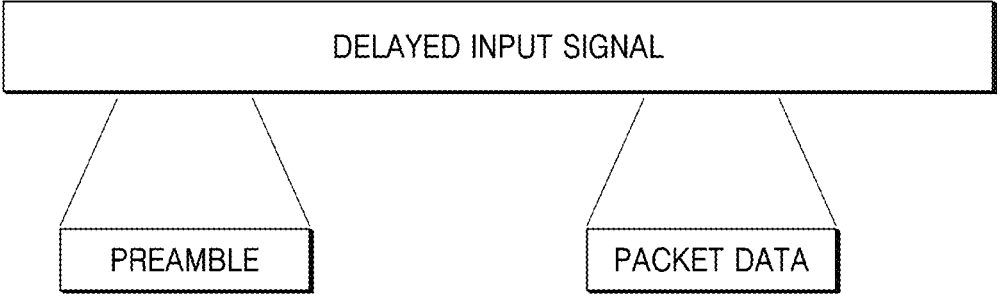
FIG. 10 is a diagram illustrating a delayed input signal, according to at least one example embodiment.

FIG. 10 is a diagram illustrating a delayed input signal according to at least one example embodiment.

The delayed input signal may include a preamble signal having a periodic waveform and/or packet data including transmitted data, but is not limited thereto. The delayed input signal illustrated in FIG. 10 may be the delayed input signal as described above with reference to FIGS. 1 to 7, but the example embodiments are not limited thereto.

Figure 11:
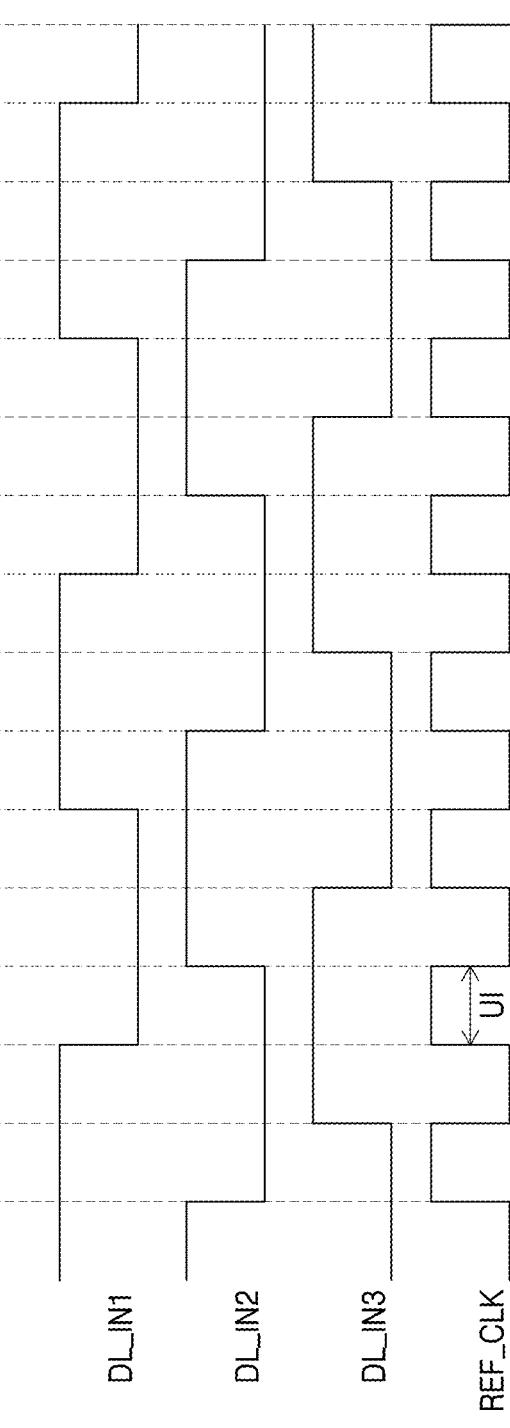
FIG. 11 is a timing diagram of signals relative to a reference clock signal, according to at least one example embodiment.

FIG. 11 is a timing diagram of signals relative to a reference clock signal according to at least one example embodiment. FIG. 11 may be described with reference to FIG. 7, but the example embodiments are not limited thereto.

In some example embodiments, the first delayed input signal DL_IN1 to the third delayed input signal DL_IN3 may have a first frequency pulse waveform.

The reference clock signal having a pulse waveform of a second frequency higher than a first frequency may be generated based on the first delayed input signal DL_IN1 to the third delayed input signal DL_IN3, but is not limited thereto.

The reference clock signal REF_CLK may be generated according to and/or based on the following equation, but is not limited thereto.

$$\text{REF\_CLK} = \{(\text{DL\_IN1 NOR DL\_IN2}) \text{NOR} (\text{DL\_IN3 NOR DL\_IN2})\} \text{NAND} \{(\text{DL\_IN1 NOR DL\_IN3}) \text{NOR test\_done}\} \qquad \text{[Equation 1]}$$

In Equation 1, NOR refers to a nor operation, and NAND refers to a nand operation. In addition, the test_done refers to an internal signal of the controller 280 indicating whether the eye margin test has been completed. A test_done value of "0" may refer to a case in which the eye margin test has not completed, and the test_done value of "1" may refer to a case in which the eye margin test has been completed, but the example embodiments are not limited thereto.

The reference eye margin detector 270 may generate reference clock signal REF_CLK according to Equation 1 and generate a reference eye margin code REMC corresponding to half a cycle (e.g., half duty cycle, etc.) of the second frequency pulse. Here, half the cycle of the second frequency pulse may refer to a unit interval. The controller 280 may obtain the eye margin time by comparing the reference eye margin code REMC with the eye margin code.

Figure 12:
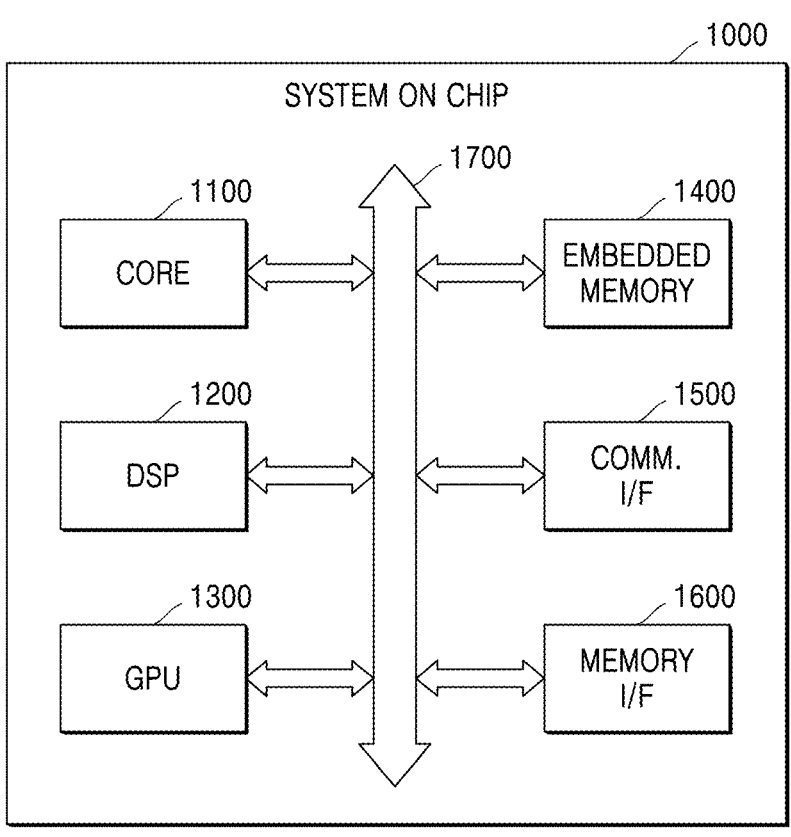
FIG. 12 is a block diagram illustrating a system on chip according to at least one example embodiment.

FIG. 12 is a block diagram illustrating a system on chip according to at least one example embodiment. The system on chip (SoC) may refer to an integrated circuit in which components of a computing system or other electronic system are integrated. For example, as one of the SoC, an application processor (AP) may include at least one processor (e.g., processor core, etc.) and/or components for other functions.

Referring to FIG. 12, the SoC 1000 may include a core 1100, a Digital Signal Processor (DSP) 1200, a Graphic Processing Unit (GPU) 1300, an embedded memory 1400, a communication interface 1500, and/or a memory interface 1600, etc., but is not limited thereto and may include a greater or lesser number of constituent components. The components of the SoC 1000 may communicate with each other through at least one bus 1700.

The core 1100 may process instructions, control operations, and/or data of one or more components included in the SoC 1000. For example, the SoC 1000 may run an operating system and execute applications on the operating system by processing a series of computer readable instructions and/or data, etc. The DSP 1200 may generate useful data by processing at least one digital signal, for example, at least one digital signal provided from the communication interface 1500, etc. The GPU 1300 may generate data for an image output through a display device from image data provided from an embedded memory 1400, memory interface 1600, and/or may encode and/or generate image data, etc. The embedded memory 1400 may store data desired and/or necessary for the operations of the core 1100, the DSP 1200, and/or the GPU 1300, etc. The memory interface 1600 may provide an interface to an external memory of the SoC 1000, such as dynamic random access memory (DRAM), flash memory, etc.

The communication interface 1500 may provide serial communication with the outside (e.g., an external destination) of the SoC 1000. For example, the communication interface 1500 may be connected to Ethernet and may include a serializer/deserializer (SERDES) for serial communication, but is not limited thereto.

Meanwhile, the electronic apparatus to which one or more example embodiments of the inventive concepts are applied may be applied to the communication interface 1500 and/or the memory interface 1600. Specifically, the communication interface 1500 and/or the memory interface 1600 may test the eye margin according to one or more example embodiments of the inventive concepts.

While various example embodiments of the inventive concepts have been particularly shown and described, it will be understood that various changes in form and details may be made therein without departing from the spirit and scope of the following claims.

What is claimed is:

1. A method of testing an eye margin, the eye margin test method comprising:

receiving an analog input signal;

converting the analog input signal into a digital input signal;

generating a recovery clock signal based on the digital input signal;

delaying the recovery clock signal by adjusting a first delay control code;

obtaining a first delay margin code based on the delayed recovery clock signal;

delaying the digital input signal by adjusting a second delay control code;

obtaining a second delay margin code based on the delayed digital input signal; and obtaining an eye margin code by adding the first delay margin code and the second delay margin code.

2. The eye margin test method of claim 1, wherein the obtaining of the first delay margin code comprises:

generating a sampling signal based on the delayed recovery clock signal and the digital input signal;

detecting a number of first sampling errors based on the sampling signal and test data;

determining a value of the first delay control code which causes the number of first sampling errors to be equal to or greater than a first error threshold; and setting the first delay margin code as the determined first delay control code value.

3. The eye margin test method of claim 1, wherein the obtaining of the second delay margin code comprises:

generating a sampling signal based on the recovery clock signal and the delayed input signal;

detecting a number of second sampling errors based on the sampling signal and test data;

determining a value of the second delay control code which causes the number of second sampling errors to be equal to or greater than a second error threshold; and setting the second delay margin code as the determined second delay control code value.

4. The eye margin test method of claim 1, further comprising:

estimating a timing skew of the digital input signal; and compensating for the timing skew by adjusting the second delay control code.

5. The eye margin test method of claim 1, wherein the digital input signal comprises a preamble signal having a first pulse waveform of a first frequency; and the eye margin test method further comprises, generating a reference clock signal having a second pulse waveform of a second frequency based on the preamble signal, the second frequency being higher than the first frequency, and obtaining a reference eye margin code from the reference clock signal.

6. The eye margin test method of claim 5, further comprising:

obtaining an eye margin time based on the reference eye margin code and the eye margin code.

7. The eye margin test method of claim 1, wherein the analog input signal is a 3-phase signal including a first sub-signal, a second sub-signal, and a third sub-signal; and the converting of the analog input signal to the digital input signal comprises converting the analog input signal into the digital input signal based on a voltage level difference between the first sub-signal, the second sub-signal, and the third sub-signal.

8. The eye margin test method of claim 7, wherein the analog input signal is a signal generated based on a C-physical layer (C-PHY) interface protocol.

9. An electronic apparatus comprising:

processing circuitry configured to, receive an analog input signal and convert the analog input signal into a digital input signal;

generate a recovery clock signal based on the digital input signal;

generate a first delay control code and a second delay control code;

generate a delayed recovery clock signal from the recovery clock signal based on the first delay control code; and generate a delayed input signal from the digital input signal based on the second delay control code; and obtain a value of an eye margin code based on a first delay margin code and a second delay margin code.

10. The electronic apparatus of claim 9, wherein the processing circuitry is further configured to:

generate a sampling signal based on the delayed input signal and the delayed recovery clock signal;

detect a number of first sampling errors based on the sampling signal and test data;

determine a first delay control code value which causes the number of the first sampling errors to be equal to or greater than a first error threshold value; and set the first delay margin code as the determined delay control code value.

11. The electronic apparatus of claim 10, wherein the processing circuitry is further configured to:

detect a number of second sampling errors based on the sampling signal and the test data;

determine a second delay control code value which causes the number of the second sampling errors to be equal to or greater than a second error threshold value; and set the second delay margin code as the determined second delay control code value.

12. The electronic apparatus of claim 9, wherein the processing circuitry is further configured to:

receive the digital input signal and the delayed input signal;

output one of the digital input signal and the delayed input signal as a selected input signal based on a mode control signal; and generate the recovery clock signal based on the selected input signal.

13. The electronic apparatus of claim 9, wherein the processing circuitry is further configured to:

estimate a timing skew of the digital input signal; and compensate for the timing skew by adjusting the second delay control code.

14. The electronic apparatus of claim 9, wherein the digital input signal comprises a preamble signal having a first pulse waveform of a first frequency; and the processing circuitry is further configured to, generate a reference clock signal having a second pulse waveform of a second frequency based on the preamble signal, the second frequency being higher than the first frequency, and obtain a reference eye margin code from the reference clock signal.

15. The electronic apparatus of claim 9, wherein the analog input signal is a 3-phase signal including a first sub-signal, a second sub-signal, and a third sub-signal; and the processing circuitry is further configured to convert the analog input signal into the digital input signal based on a voltage level difference between the first sub-signal, the second sub-signal, and the third sub-signal.

16. An electronic apparatus comprising:

processing circuitry configured to, generate a mode control signal, an input delay control code, and a clock signal delay control code;

generate a second input signal delayed from a first input signal based on the input delay control code;

output one of the first input signal and the second input signal as a selected input signal based on the mode control signal;

generate a recovery clock signal based on the selected input signal;

generate a delayed recovery clock signal from the recovery clock signal based on the clock signal delay control code; and obtain a value of an eye margin code based on a clock signal delay margin code and an input delay margin code.

17. The electronic apparatus of claim 16, wherein the processing circuitry is further configured to:

generate a sampling signal based on the second input signal and the delayed recovery clock signal;

detect a number of first sampling errors based on the sampling signal and test data;

determine a clock signal delay control code value which causes the number of the first sampling errors to be equal to or greater than a first error threshold value; and set the clock signal delay margin code as the determined clock signal delay control code value.

18. The electronic apparatus of claim 17, wherein the processing circuitry is further configured to:

detect a number of second sampling errors based on the sampling signal and the test data;

determine an input delay control code value which causes the number of the second sampling errors to be equal to or greater than a second error threshold value; and set the input delay margin code as the determined input delay control code value.

19. The electronic apparatus of claim 18, wherein the processing circuitry is further configured to:

obtain the value of the eye margin code by adding the clock signal delay margin code and the input delay margin code.

20. The electronic apparatus of claim 16, wherein the processing circuitry is further configured to:

estimate a timing skew of the first input signal; and compensate for the timing skew by adjusting the input delay control code.

* * * * *